April 16, 1963 R. B. HEIART 3,085,488

IMAGE REPRODUCTION APPARATUS

Filed July 13, 1961

INVENTOR
ROBERT BERNARD HEIART

BY *Weston B. Wardell Jr.*

ATTORNEY

United States Patent Office 3,085,488
Patented Apr. 16, 1963

3,085,488

IMAGE REPRODUCTION APPARATUS

Robert Bernard Heiart, Middletown, N.J., assignor to E. I. du Pont de Nemours and Company, Wilmington, Del., a corporation of Delaware Filed July 13, 1961, Ser. No. 123,854
18 Claims. (Cl. 95—75)

Figure 1:
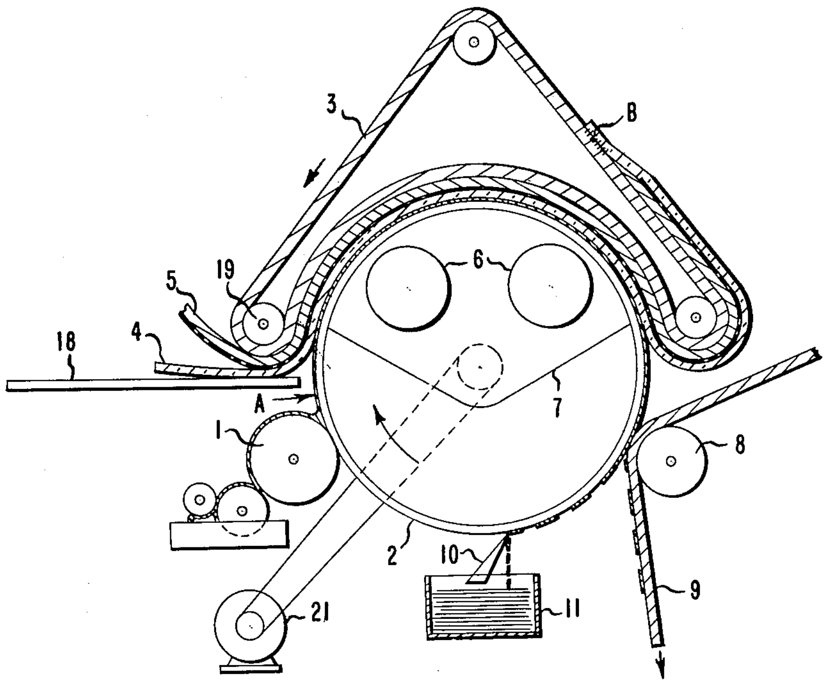

This invention relates to an image-reproduction apparatus. More particularly it relates to such an apparatus which is useful with radiation-sensitive compositions. Specifically it relates to such an apparatus which is capable of operating at normal atmospheric conditions and room temperature.

An object of this invention is to provide a simple and efficient apparatus capable of imagewise exposing a radiation-sensitive, e.g., a photopolymerizable stratum, and transferring an image corresponding to the underexposed image areas of the stratum to an image-receptive support. Another object of this invention is to provide such an apparatus in which the exposure is carried out reflectographically. A further object is to provide such an apparatus in which the radiation-sensitive composition is exposed between reusable actinic radiation-transmitting surfaces. A still further object is to provide such an apparatus in which the process is carried out in an intergrated sequence of operations at normal atmospheric conditions and room temperature. Still further objects will be apparent from the following description of the invention.

The apparatus for making reproductions of an image at room temperature by exposing, imagewise, to actinic radiation a radiation-sensitive stratum comprises (1) Means for forming a stratum of a radiation-sensitive composition on the surface of a movable carrier which transmits actinic radiation, said carrier upon movement transporting said radiation-sensitive composition;

(2) Means for bringing into intimate contact with said stratum at least during exposure a covering surface, said covering surface being capable of uniformly transmitting actinic radiation and having low permeability to oxygen, and for separating said covering surface from the exposed stratum;

(3) A source of actinic radiation for exposing said stratum through the carrier from an image-bearing medium;

(4) Means for pressing the resulting exposed surface of said stratum, subsequent to separation of said covering surface, into intimate contact with the surface of an image- receptive support and separating said two surfaces whereby an image corresponding to the underexposed image areas is transferred to the surface of said image-receptive support; and (5) Means for removing the portion of the stratum remaining on said carrier.

Figure 2:
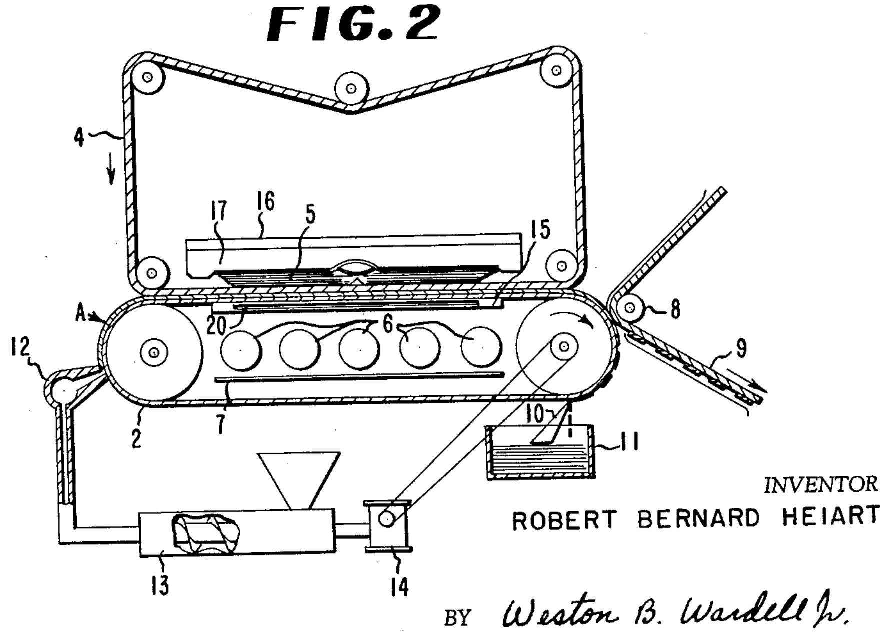

The novel apparatus will now be more fully described with reference to the accompanying drawing which forms a part of this application. In the drawing, the same reference numerals refer to the corresponding parts of the figures. With reference to the drawing FIG. 1 is a schematic side elevational view of one embodiment of the invention;

FIG. 2 is a schematic side elevational view of another embodiment of the invention.

In the embodiment of the invention shown in FIG. 1, a coating roll 1, e.g., a reverse roll coater, is positioned adjacent to a movable carrier 2, e.g., a rotatable cylinder, which transmits actinic radiation. A thin stratum of radiation-sensitive material, e.g., a photopolymerizable composition A, is formed on the surface of the carrier and is transported by the carrier. Around the upper surface of the carrier is disposed a pressure belt 3 which is preferably adapted to move in synchronization with the carrier. At point B on the pressure belt 3, a covering surface 4 is attached, the covering surface being capable of uniformly transmitting actinic radiation and having low permeability to oxygen. The covering film at one phase during its cycle lies between the radiation-sensitive stratum and the belt. An image-bearing medium 5 is inserted between the belt 3 and covering surface 4 as will be explained more fully below. Positioned below the upper surface of the carrier is a source of actinic radiation 6 for exposing the radiation-sensitive stratum. The radiation source illustrated in FIG. 1 comprises two lamps but the utilization of a single lamp, a multiplicity of lamps stationary or scanning, is within the scope of this invention. A light reflector 7, which also functions as a light shield, is positioned below the source of radiation to provide for better control and prevent excess diffusion of the radiation. Positioned adjacent to the cylindrical carrier at a point on the side of the carrier opposite the coating roll and below the point where the covering surface is separated from the stratum is a pressure roll 8. The roll is used to press an image-receptive support 9 into contact with the surface of the exposed stratum whereby an image is transferred to the support surface. At a point below the bottom periphery of the cylinder a scraping device 10, e.g., a scraper blade, is placed to remove the portion of the stratum remaining on the carrier. The removed portion is then collected in a container 11 located below the scraper.

In the embodiment of the invention shown in FIG. 2 which is designed to copy by intermittent exposure, an extrusion applicator 12 is used to form the radiation-sensitive stratum A on the movable actinic radiation-transmitting carrier 2, e.g., a flexible belt. The extruder device illustrated is fitted with a screw feed 13 driven by power source 14, e.g., an electric motor and associated driving mechanism, linked to the carrier through an appropriate reducing gear device (not shown) which insures that the radiation-sensitive material is extruded only when the carrier is in motion. Belt covering surface 4 which uniformly transmits actinic radiation and has low permeability to oxygen is in intimate contact with the radiation-sensitive stratum during the exposure. Positioned immediately below said carrier, between the radiation source and the stratum, is an actinic radiation-transmitting plate 15. The plate supports the image-bearing medium 5 which can be more bulky than the medium used in the embodiment of FIG. 1, e.g., a book. Attached above the upper surface of the carrier belt over the plate 15 is a pressure device or plate 16 fitted with a pressure cushion 17. The pressure cushion which presses the image-bearing medium into contact with the radiation-sensitive stratum may be a gas-filled, gas-tight bag made of a suitable plastic, impregnated fabric or a resilient, foamed elastomer such as natural or synthetic rubber, polyurethane, etc. The remainder of the apparatus is similar to the embodiment shown in FIG. 1, i.e., a light reflector 7 is positioned below the exposure source 6; a pressure roll 8 is positioned adjacent the carrier opposite the extrusion applicator and below the point where the belt covering surface 4 is separated from the stratum and the scraping device 10 and container 11 are positioned below the bottom surface of the carrier.

The apparatus of FIG. 1 can operate either continuously or intermittently. In operation, at the beginning of a cycle, the covering surface attached to the pressure belt will lie extended on a support 18, e.g., a table, with point B under or to the left of pressure belt roller 19. As the cycle begins, a thin stratum of the radiation-sensitive, e.g., photopolymerizable, composition is formed on the surface of the movable carrier. Simultaneously the image-bearing medium 5 is fed between the pressure belt 3 and the covering surface 4. The assembly 3, 4, 5 is then transported around the cylinder with the radiation-sensitive stratum lying between the surface of the carrier and the covering surface. As the stratum passes the left-hand edge of the light reflector (shield), it is exposed to the actinic radiation source. The stratum is progressively exposed through the carrier and stratum as it passes around the cylinder until it passes out of the range of the actinic radiation source where the assembly 3, 4, 5 is separated from the stratum. Immediately the exposed stratum is pressed into intimate contact with the surface of an image-receptive support, e.g., paper, the underexposed image areas transferring to the image-receptive support as it is separated from the stratum. The remaining portion of the stratum on the carrier is subsequently removed from the carrier by a scraping device. The residue is collected and is discarded. In continuous operation, repeated copies of the same image can be made or the image can be changed by inserting a new image-bearing medium between the pressure belt and the covering surface.

The embodiment shown in FIG. 2 operates in essentially the same manner as the apparatus of FIG. 1, except that the exposure must be intermittent. As previously indicated, this apparatus is designed to copy from a book as well as a single sheet image-bearing medium. It is also possible to expose the photopolymerizable layer directly, e.g., through an image-bearing transparency inserted in slot 20 in the radiation-transmitting plate 15. In operation, the forming of the radiation-sensitive stratum on the carrier belt is begun and the stratum is transported by the carrier until it extends over the top of the radiation-transmitting plate. The apparatus is stopped, the image-bearing medium is placed in position face down and is held in position by the pressure plate 16 fitted with the pressure cushion 17. The radiation source is then turned on and the stratum exposed reflectographically for a suitable period of time to expose the stratum in the reflecting areas. The image-bearing medium is then removed and the machine is started again bringing the exposed stratum into contact with an image-receptive support subsequent to the removal of the covering surface. The remainder of the cycle is similar to that described above for the apparatus of FIG. 1.

The apparatus can be driven by any suitable driving means 21 such as the motor-driven belt shown in FIG. 1 or by the power source 14, e.g., an electric motor and associated driving mechanism linked to one of the carrier drums by a belt as shown in FIG. 2. Other driving means, e.g., power-driven drive shafts, pulleys, gear arrangements, etc., are also suitable.

Many modifications and refinements of the apparatus will be apparent to those skilled in the art. The apparatus may be readily arranged to make operation more automatic and to arrange for the various operations to proceed in timed relationship. In the embodiment of FIG. 1, synchronization between roll 19 and carrier 2 can be accomplished by suitable belt and gear arrangements. For example, a belt from power source 21 can operate a gear arrangement (not shown in the drawing) to turn roll 19 at the same peripheral speed as the carrier. The apparatus can also be modified to have both the image-bearing medium and the image-receptive sheets fed automatically in timed relationship. For example, a roll-over stacking device similar to that shown in assignee's Velvel application Serial No. 20,105, filed April 5, 1960, now Patent No. 3,046,008, could be readily modified to feed original sheets to be copied automatically onto the covering sheet of FIG. 1 in timed sequence. In addition, the image-receptive supports could be automatically, either successively or from a roll which could be chopped or not after transfer as desired. In the apparatus of FIG. 2 electrical circuitry can be provided readily to synchronize the start of coating to the raising of the pressure plate for the insertion of material to be copied, and the actinic radiation source can be automatically turned on by the release of the pressure plate to hold the copy. Other steps of the operation could also be controlled automatically in synchronism as desired. For example, the power source which drives the belt carrier can also drive the screw feed of the extruder. By a suitable choice of pulleys or a gear arrangement between the carrier drum and power source, the carrier can be synchronized to move only when material is being extruded.

In the apparatus, the supply of radiation-sensitive material can be from collapsible tubes, aerosol or pressurized bombs, cartridges, etc., in addition to standard coating and extrusion devices, and can be arranged to spread either a film or to deposit a single bead for each cycle of the machine. In the latter case, uniform speading of the material would be accomplished by the pressure between the covering surface and the surface to which the radiation-sensitive composition is initially applied, i.e., the rotatable cylinder of FIG. 1, or the flexible belt carrier of FIG. 2.

The radiation-sensitive materials useful in the apparatus preferably are free-radical initiated photopolymerizable compositions. Suitable compositions are disclosed in assignee's Heiart application entitled Image Reproduction Process, Serial No. 123,651, filed July 13, 1961. A stratum of the photopolymerizable composition has a stick temperature below 30° C. and comprises a non-gaseous ethylenically unsaturated compound containing at least one terminal ethylenic group, e.g., 1 to 4 terminal ethylenic groups, having a boiling point above 100° C. at normal atmospheric pressure and being capable of forming a high polymer by free-radical initiated, chain-propagating addition polymerization. The composition, which can be exposed, imagewise, and the under-exposed image areas transferred at normal atmospheric conditions and room temperature, can also contain viscosity-modifying agents such as thermoplastic polymeric compounds, inorganic fillers, solvents, plasticizers, etc., and small amounts of a free-radical generating addition polymerization initiator and an addition polymerization inhibitor.

Other useful radiation-sensitive materials include those disclosed in U.S. Patents 1,574,357; 2,690,966; 2,704,712; 2,725,372; 2,875,047; 2,972,540 and in assignee's Burg application Serial No. 807,316, filed April 20, 1959 (particularly those compositions containing hydrogen donor compounds). The polymerizable compositions must be soft and transferable in the underexposed image area at room temperature. Since some of the above-described compositions are solid at normal temperatures, suitable solvents, plasticizers and other adjuvants are added to insure that the materials are easily transferable.

The parts of the apparatus can be made from various materials as will be understood by those skilled in the art.

Coating roll 1 can be a large metal roll covered with a resilient material, e.g., neoprene, polysulfide elastomers, silicone rubber, butyl rubber, etc., or can be made solely from the resilient materials. The small rolls are generally of hard materials, e.g., metals such as steel, brass, etc.; glass or plastic. While a reverse roll coater is shown in FIG. 1, single roll and other type coaters can be used as well as the extrusion applicator shown in FIG. 2. The extrusion applicators may be of metal, molded or extruded plastic, etc.

The carrier 2 which uniformly transmits actinic radiation may be a cylinder (FIG. 1) or a flexible belt (FIG. 2). The cylindrical embodiment may be made of glass, plastics, e.g., polyacrylates; polymethacrylates, polystyrene, etc., and may be tinted or colored provided it is capable of transmitting radiation of the wave length to which the photopolymerizable composition is sensitive. The flexible belt embodiment may be any material having a low permeability to oxygen to substantially reduce the oxygen inhibition effect, e.g., regenerated cellulose, cellulose esters, e.g., cellulose acetate, cellulose propionate, etc., polyesters, e.g. polyethylene terephthalate, polypropylene terephthalate, polyethylene terephthalate-isophthalate copolymer, polycarbonate, etc.; polyethylene; polypropylene; vinylidene chloride/acrylonitrile copolymers; polyacrylonitrile; polyvinyl alcohol, polyvinyl resins, polyvinylchloride and copolymers thereof, acrylonitrile/butadiene/styrene copolymers, etc. Impregnated fibrous materials meeting the required criteria are also useful. The lower the permeability of the flexible belt to oxygen the better will be the results.

The covering surface 4 of FIG. 1 may be any of the film materials used for the flexible belt carrier. In addition, transparentized paper may also be used. The covering surface is attached to the pressure belt by any suitable attaching means, such as pressure-sensitive adhesives, stapling, etc. The belt covering surface of FIG. 2 may also be any of the film materials used for the flexible belt carrier as described above.

Pressure belt 3 may be of material or synthetic woven or felted fibers, e.g., cotton, nylon, polyesters, which may be coated or impregnated with elastomers. Flexible plastic sheeting may also be used, such as polyethylene terephthalate, polyethylene, polyvinyl resins, and any of the other materials described above for the flexible belt carrier of FIG. 2.

The exposure source 6 may be any type which provides radiation to which the radiation-sensitive materials are sensitive. The photopolymerizable compositions are generally initiated by free-radical generating addition-polymerization initiators activatable by actinic radiation. Since these initiators usually exhibit their maximum sensitivity in the ultarviolet range, the radiation source should usually furnish an effective amount of this radiation. Such sources include single or multiple carbon arcs, mercury-vapor arcs, fluorescent lamps with ultraviolet radiation-emitting phosphors, argon glow lamps, electronic flash units, halogen vapor tungsten filament lamps, and photographic flood lamps. Of these, the mercury-vapor arcs, particularly the sunlamp type, and fluorescent lamps, are most suitable. It is noted, however, that in certain circumstances it may be advantageous to expose with visible light, using a photoinitiator senstive in the visible region of the spectrum, e.g., 9,10-phenanthrenequinone. In such cases, the radiation source should furnish an effective amount of visible radiation, e.g., incandescent lamp. Many of the radiation sources listed above also furnish the required amount of visible light.

The light reflector 7 may be formed of plastics, metal, resin impregnated fibre glass, etc., sufficiently opaque to prevent passage of light. It has a light-reflecting or light-diffusing surface, e.g., polished metal, silvered glass or plastic. The reflector may also function as a light shield.

The various rolls, such as pressure roll 8 and pressure belt roller 19 may be made of metal, wood, plastic, etc., and may have hard or resilient surfaces of the type described above. The scraper device 10 which may be a scraper blade, abrading device, etc., may be of metal, e.g., steel, brass, bronze, glass or plastic. Any standard type container can be used to collect the residue remaining on the carrier.

In the embodiment of FIG. 2, an actinic radiation-transmitting plate is used to support the carrier belt and the comparatively heavy image-bearing medium. Suitable materials for the plate include glass, plastics, such as polyacrylic acid esters, polymethyl acrylate, polyethylmethacrylate, etc. Also in the FIG. 2 embodiment is a pressure plate 16 fitted with a pressure cushion. The pressure plate can be of metal, wood, rigid plastic, etc.

The apparatus is useful for the preparation of image-reproductions, particularly from photopolymerizable compositions. Generally the apparatus is used with an image-bearing medium which reflects the radiation in certain areas. Image-bearing transparencies may be copied reflectographically, however, by using a reflective material, e.g., a laminated aluminum foil/polyethylene terephthalate web with a polished surface for pressure belt 3 of FIG. 1. Direct exposure can be accomplished in the embodiment of FIG. 2 by inserting an image-bearing transparency in a slot in the radiation-transmitting plate, in a holding rack or plate positioned between the radiation source and transmitting plate or between the transmitting plate and pressure belt.

The apparatus can be modified so that after the exposure and removal of the covering surface the photopolymerized stratum can be brought into intimate contact with a roll, e.g., of carbon or graphite, coated with pigment dispersions, adapted to continuously replenish pigments, etc. The thus-treated surfaec is then brought into contact with the image-receptive support. In like manner, a dusting means, e.g., a blower, nip wheel, etc., can be placed adjacent to the pressure roll to dust the exposed stratum prior to contact with the image-receptive support.

An advantage of this invention is that the apparatus is simple and effective and operates at room temperature under normal atmospheric conditions. Another advantage of this invention is that the apparatus is easily adaptable to both intermittent and continuous operation. A particular advantage of this invention is that the covering surface and carrier are continuously reusable and only the radiation-sensitive composition and image-receptive support are expended during the transfer operation. Still further advantages will be apparent from the foregoing description of the invention.

What is claimed is:

1. An image reproduction apparatus comprising, in combination, (1) means for forming a stratum of a radiation-sensitive composition on the surface of a movable carrier which transmits actinic radiation, said carrier upon movement transporting said radiation-sensitive composition;

(2) means for bringing into intimate contact with said stratum at least during exposure a covering surface, said covering surface being capable of uniformly transmitting actinic radiation and having low permeability to oxygen, and for separating said covering surface from the exposed stratum;

(3) a source of actinic radiation for exposing said stratum through the carrier from an image-bearing medium;

(4) means for pressing the resulting exposed surface of said stratum, subsequent to separation of said covering surface, into intimate contact with the surface of an image-receptive support and separating said two surfaces whereby an image corresponding to the underexposed image areas is transferred to the surface of said image-receptive support; and (5) means for removing the portion of the stratum remaining on said carrier.

2. An apparatus as defined in claim 1 wherein said carrier is a rotatable cylinder.

3. An apparatus as defined in claim 1 wherein said carrier is a flexible belt.

4. An apparatus as defined in claim 3 wherein an actinic radiation-transmitting plate is placed between said carrier and said radiation source, said plate supporting said carrier.

5. An apparatus as defined in claim 1 wherein a light reflector is positioned below said actinic radiation source.

6. An apparatus as defined in claim 1 wherein said coating means is a roll.

7. An apparatus as defined in claim 1 wherein said coating means is an extrusion applicator.

8. An apparatus as defined in claim 1 wherein said means for bringing said covering surface into contact with said radiation-sensitive stratum at least during exposure comprises an endless pressure belt having attached at one point on its outer surface a film capable of uniformly transmitting actinic radiation and having low permeability to oxygen and wherein said image-bearing medium is capable of being inserted between said belt and said attached film.

9. An apparatus as defined in claim 1 wherein said means for bringing said covering surface into contact with said stratum at least during exposure is adapted to move in synchronization with said carrier.

10. An apparatus as defined in claim 1 wherein said pressing means comprises a pressure roll.

11. An apparatus as defined in claim 1 wherein said removal means is a scraper blade.

12. An apparatus as defined in claim 1 wherein the source of actinic radiation is a single lamp.

13. An apparatus as defined in claim 1 wherein the source of actinic radiation is a series of lamps.

14. An apparatus as defined in claim 1 wherein the source of actinic radiation moves across an area co-extensive with the area of said image-bearing medium.

15. An apparatus as defined in claim 1 wherein said source of actinic radiation is positioned for exposing said stratum through the carrier and the stratum and by means of reflected radiation from said image-bearing medium placed beyond the stratum.

16. An apparatus as defined in claim 1 wherein the image-bearing medium is maintained in position over said carrier by means of a pressure plate fitted with a pressure cushion.

17. An apparatus as defined in claim 16 wherein said pressure cushion is a gas-filled bag.

18. In the art of making reproductions of an image at room temperature by exposing, imagewise, to actinic radiation a photopolymerizable stratum having a stick temperature below 30° C. and comprising a non-gaseous ethylenically unsaturated compound containing at least one terminal ethylenic group, having a boiling point above 100° C. at normal atmospheric pressure and being capable of forming a high polymer by free-radical initiated, chain-propagating, addition polymerization and subsequently transferring an image corresponding to the underexposed image areas of said stratum to the surface of an image-receptive support, an apparatus comprising, in combination, (1) means for forming a stratum of a photopolymerizable composition on the surface of a movable carrier which transmits actinic radiation, said carrier upon movement transporting said photopolymerizable composition;

(2) means for bringing into intimate contact with said stratum at least during exposure a covering surface, said covering surface being capable of uniformly transmitting actinic radiation and having low permeability to oxygen, and for separating said covering surface from the exposed stratum;

(3) a source of actinic radiation for exposing said stratum through the carrier from an image-bearing medium;

(4) means for pressing the resulting exposed surface of said stratum, subsequent to separation of said covering surface, into intimate contact with the surface of an image-receptive support and separating said two surfaces whereby an image corresponding to the underexposed image areas is transferred to the surface of said image-receptive support; and (5) means for removing the portion of the stratum remaining on said carrier.

References Cited in the file of this patent

UNITED STATES PATENTS 2,917,985 Williamson ------------ Dec. 22, 1959